United States Patent
French et al.

(10) Patent No.: US 10,256,257 B2
(45) Date of Patent: Apr. 9, 2019

(54) DISPLAY PANEL, PIXEL ARRAY SUBSTRATE AND LINE ARRAY STRUCTURE

(71) Applicant: E Ink Holdings Inc., Hsinchu (TW)

(72) Inventors: Ian French, Hsinchu (TW); Chi-Ming Wu, Hsinchu (TW); Kuang-Heng Liang, Hsinchu (TW); Shu-Fen Tsai, Hsinchu (TW); Jia-Hung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/668,706

(22) Filed: Aug. 4, 2017

(65) Prior Publication Data

US 2018/0130824 A1    May 10, 2018

(30) Foreign Application Priority Data

Nov. 9, 2016    (CN) .......................... 2016 1 0983444

(51) Int. Cl.
| | | |
|---|---|---|
| *H01L 27/12* | (2006.01) | |
| *G02F 1/136* | (2006.01) | |
| *G02F 1/1362* | (2006.01) | |
| *H01L 23/64* | (2006.01) | |

(52) U.S. Cl.
CPC ...... *H01L 27/124* (2013.01); *G02F 1/136286* (2013.01); *H01L 23/64* (2013.01); *H01L 27/1218* (2013.01); *G02F 2201/56* (2013.01)

(58) Field of Classification Search
CPC ... H01L 27/124; H01L 27/1218; H01L 23/64; G02F 1/126286; G02F 2201/56; G09G 3/3611; G09G 3/2085; G09G 2300/0404; G09G 2310/0283; G09G 2310/0281
See application file for complete search history.

(56) References Cited

U.S. PATENT DOCUMENTS

| | | | |
|---|---|---|---|
| 8,958,046 B2 | 2/2015 | Shin et al. | |
| 2005/0225690 A1* | 10/2005 | Battersby | ............ G02F 1/13336 349/41 |
| 2008/0012794 A1 | 1/2008 | Battersby | |
| 2008/0018583 A1 | 1/2008 | Knapp et al. | |
| 2008/0088568 A1* | 4/2008 | Haga | ........................ G09G 3/18 345/100 |

(Continued)

*Primary Examiner* — Galina Yushina
(74) *Attorney, Agent, or Firm* — JCIPRNET

(57) ABSTRACT

A line array structure is provided, including long wirings, short wirings, first dummy wirings and connection lines. The substrate has an elongated region, a protruding region and a drive connection region. The elongated region has first sides and second sides that respectively extend along a long-side and short-side directions. The protruding region protrudes out from the first side and is connected to the elongated region. The drive connection region is connected to the second side of the elongated region. The long wirings are disposed in the elongated region and extend to the drive connection region. The short wirings are disposed in the protruding region and are parallel with the long wirings. The first dummy wirings are disposed in the elongated region and extend to the drive connection region. Each of the short wirings is electrically connected to a corresponding first dummy wiring through one first connection lines.

18 Claims, 4 Drawing Sheets

(56) References Cited

U.S. PATENT DOCUMENTS

| | | | |
|---|---|---|---|
| 2010/0066967 A1* | 3/2010 | Takahashi | G02F 1/1345 349/143 |
| 2010/0141570 A1* | 6/2010 | Horiuchi | G09G 3/3611 345/100 |
| 2015/0001540 A1* | 1/2015 | Chang | G09G 3/20 257/59 |
| 2015/0129880 A1* | 5/2015 | Wu | G09G 3/344 257/72 |
| 2015/0214246 A1* | 7/2015 | Wu | H01L 27/124 257/347 |
| 2015/0302811 A1* | 10/2015 | Park | G09G 3/3614 345/212 |
| 2016/0027380 A1* | 1/2016 | Kim | G09G 3/3258 315/172 |
| 2016/0055779 A1 | 2/2016 | Lee et al. | |
| 2016/0125844 A1 | 5/2016 | Lee | |
| 2016/0307534 A1* | 10/2016 | Wu | G09G 3/3688 |
| 2017/0135216 A1* | 5/2017 | Cho | H05K 1/189 |
| 2017/0307950 A1* | 10/2017 | Bennett | G02F 1/136286 |

* cited by examiner

DISPLAY PANEL, PIXEL ARRAY SUBSTRATE AND LINE ARRAY STRUCTURE

CROSS-REFERENCE TO RELATED APPLICATION

This application claims the priority benefit of China application serial no. 201610983444.0, filed on Nov. 9, 2016. The entirety of the above-mentioned patent application is hereby incorporated by reference herein and made a part of this specification.

BACKGROUND OF THE INVENTION

1. Field of the Invention

The present invention generally relates to a line array structure, in particular, relates to a pixel array substrate and display panel including the line array structure.

2. Description of Related Art

With the increasing trend of diversification in electronic product designs, a variety of display panels having irregular/non-rectangular display areas, such as watch shaped display panels have been currently developed. However, in such type of electronic products, since the display area is not a fixed rectangular area, it is likely that a problem of unbalanced impedance value will occur. For example, in display products having a circular shape, in order to connect signal lines to both sides of the display region, since the way of connecting the signal line changes gradually, a problem of unbalanced impedance value will be present when driving the signal lines. As such, a serious color unevenness will occur when displaying the graphics, which ultimately affects the display quality of the electronic products. In order to meet the market demands, there is an urgent need for an electronic product that is capable of resolving the unbalanced impedance value problem in non-rectangular displays.

SUMMARY OF THE INVENTION

Accordingly, the present invention provides a line array structure that can be used to resolve the unbalanced impedance value problem.

The line array structure of the present invention includes a substrate, a plurality of long wirings, a plurality of short wirings, a plurality of first dummy wirings and a plurality of first connection lines. The substrate has an elongated region, a protruding region and a drive connection region. The elongated region has first sides that extend along a long-side direction and second sides that extend along a short-side direction. The protruding region protrudes out from the first sides and is connected to the elongated region. The drive connection region is connected to the second side of the elongated region. The plurality of long wirings are disposed in the elongated region, and are parallel with the long-side direction and extends to the drive connection region. The plurality of short wirings are disposed in the protruding region, and are parallel with the long wirings. The plurality of first dummy wirings are disposed in the elongated region, and are parallel with the long-side direction and extends to the drive connection region. Each of the short wirings is electrically connected to a corresponding first dummy wiring through one of the first connection lines.

In an embodiment of the invention, the line array structure further comprises a driving circuit disposed in the drive connection region, wherein, the long wirings and the first dummy wirings extend to the drive connection region and are electrically connected to the driving circuit.

In an embodiment of the invention, each of the long wirings is disposed adjacent to at least one of the first dummy wirings.

In an embodiment of the invention, the long wirings and the first dummy wirings have the same length.

In an embodiment of the invention, a length L2 of a connection side connecting the protruding region to the elongated region is smaller than a length L1 of the first sides.

In an embodiment of the invention, the line array structure further comprises a plurality of second dummy wirings and a plurality of second connection lines. The plurality of second dummy wirings are disposed in the protruding region, and are parallel with the first dummy wirings. Each of the long wirings is electrically connected to a corresponding second dummy wiring through one of the second connection lines.

In an embodiment of the invention, each of the short wirings is disposed adjacent to at least one of the second dummy wirings.

In an embodiment of the invention, the long wirings and the short wirings are data lines or scan lines.

The present invention further provides a pixel array substrate that can be used to resolve the unbalanced impedance value problem.

The pixel array substrate of the present invention includes a substrate and a pixel array. The substrate has a first region, a second region and a drive connection region. The first region has first sides that extend along a long-side direction and second sides that extend along a short-side direction. The second region protrudes out from the first sides and is connected to the first region. The drive connection region is connected to the second side of the first region. The pixel array is located on the substrate, wherein the pixel array includes a plurality of pixel structures, a plurality of first signal lines and a plurality of second signal lines, a plurality of first dummy wirings and a plurality of first connection lines. The pixel structures are disposed in the first region and the second region, wherein each pixel structure includes a pixel electrode and an active device. The plurality of first signal lines and the plurality of second signal lines are electrically connected to the corresponding pixel structure respectively, and the first signal lines and the second signal lines are used to drive the pixel structures. The first signal lines or the second signal lines includes a plurality of long wirings and a plurality of short wirings. The long wirings are disposed in the first region, and are parallel with the long-side direction and extend to the drive connection region, and the short wirings are disposed in the second region, and are parallel with the long wirings. The plurality of first dummy wirings are disposed in the first region, and are parallel with the long-side direction and extend to the drive connection region. Each of the short wirings is electrically connected to a corresponding first dummy wiring through one of the first connection lines.

In an embodiment of the invention, the pixel array substrate further includes a driving circuit disposed in the drive connection region, wherein the long wirings and the first dummy wirings extend to the drive connection region and are electrically connected to the driving circuit.

In an embodiment of the invention, each of the long wirings is disposed adjacent to at least one of the first dummy wirings.

In an embodiment of the invention, the long wirings and the first dummy wirings have the same length.

In an embodiment of the invention, a length L2 of a connection side connecting the second region to the first region is smaller than a length L1 of the first sides.

In an embodiment of the invention, the pixel array substrate further comprises a plurality of second dummy wirings and a plurality of second connection lines. The plurality of second dummy wirings are disposed in the second region, and are parallel with the first dummy wirings. Each of the long wirings is electrically connected to a corresponding second dummy wiring through one of the second connection lines.

In an embodiment of the invention, each of the short wirings is disposed adjacent to at least one of the second dummy wirings.

In an embodiment of the invention, the first signal lines are data lines, and the second signal lines are scan lines.

In an embodiment of the invention, the first signal lines are scan lines, and the second signal lines are data lines.

The present invention further provides a display panel, that can be used to resolve the unbalanced impedance value problem. The display panel of the present invention includes a pixel array substrate described above and a display medium, wherein the display medium is driven by the pixel array substrate for display.

Based on the above, in the line array structure, pixel array substrate and display panel of the present invention, since the short wiring is electrically connected to a corresponding first dummy wiring through one of the first connection lines, and the first dummy wirings and the long wirings both extends to the drive connection region, therefore, the impedance value difference formed between the long wirings and the short wirings may be reduced, and the unbalanced impedance value problem may be resolved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
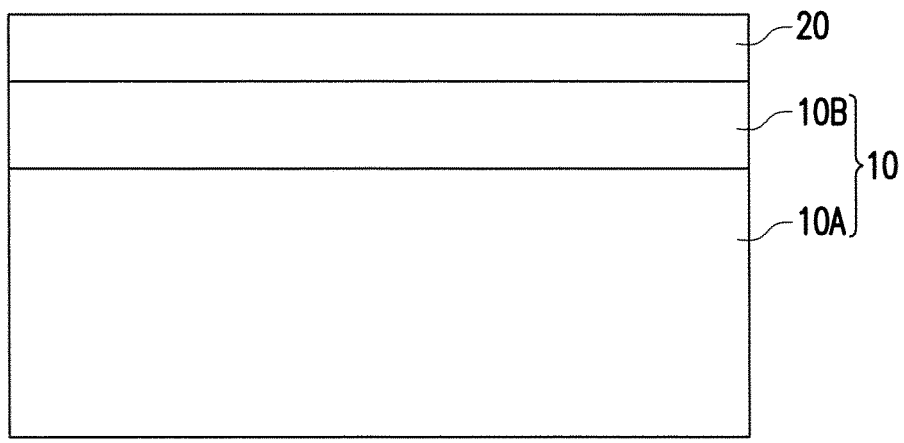
FIG. 1A is a display panel according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a display panel according to an embodiment of the invention. As shown in FIG. 1A, the display panel DP includes a pixel array substrate 10 and a display medium 20, wherein the display medium 20 is driven by the pixel array substrate 10 for display, and the pixel array substrate 10 includes a pixel array 10B and a substrate 10A. In the present embodiment, a material of the substrate 10A may include glass, quartz, organic polymers, or opaque/reflective materials (for example: conductive material, metal, wafers, ceramic or any other suitable materials), or any other suitable materials. If a conductive material or metal is used, then an insulating layer (not shown) is disposed on the substrate so as to avoid a short-circuit problem. In the application of flexible devices, the substrate may have flexible properties. The pixel array 10B is disposed on the substrate 10A, and is used for transmitting a drive signal for driving the display medium 20. Furthermore, the display medium 20 may include liquid crystal molecules, electrophoretic display medium, or any other suitable mediums. In the following embodiments of the present disclosure, display medium 20 are exemplified by liquid crystal molecules, but are not particularly limited thereto. In addition, the liquid crystal molecules in the following embodiments of the invention are preferably, liquid crystal molecules that can be rotated or switched by a horizontal electrical field or liquid crystal molecules that can be rotated or switched by a transverse electrical field, but are not particularly limited thereto.

Figure 1B:
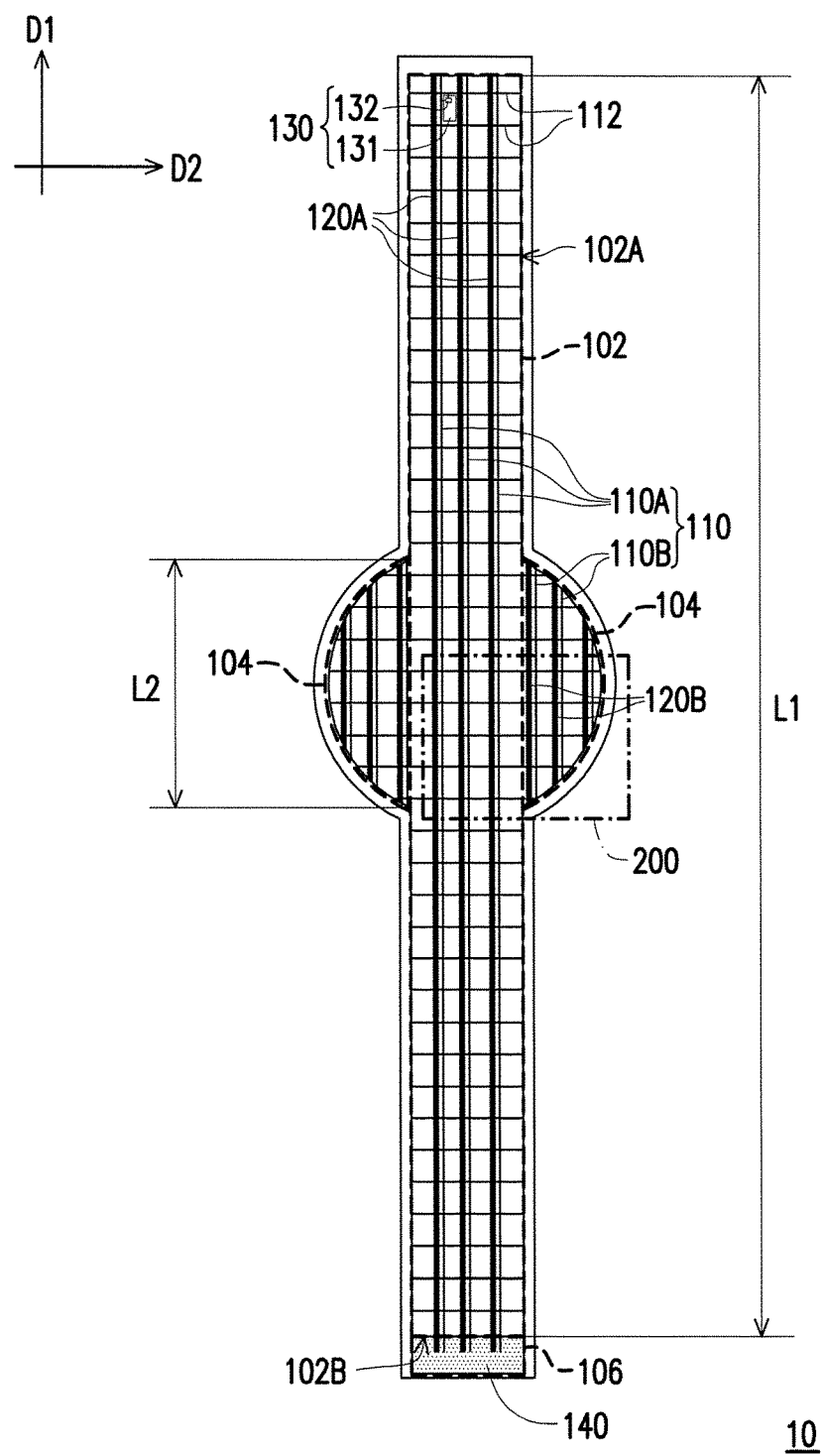
FIG. 1B is a schematic top view of a pixel array substrate in a display panel according to an embodiment of the invention.

More specifically, referring to FIG. 1B, it illustrates a pixel array substrate in a display panel according to an embodiment of the invention. As shown in the embodiment of FIG. 1B, the pixel array substrate is exemplified by a display panel having a watch shape for example, however, the present invention is not limited thereto. Referring to FIG. 1B, the pixel array substrate 10 includes the pixel array 10B and the substrate 10A as shown in FIG. 1A. The substrate 10A has a first region such as an elongated region 102, a second region such as a protruding region 104 and a drive connection region 106. The elongated region 102 has first sides 102A that extend along a long-side direction D1 and second sides 102B that extend along a short-side D2. The protruding region 104 protrudes out from the first sides 102A and is connected to the elongated region 102. Furthermore, the drive connection region 106 is connected to the second side 102B of the elongated region 102.

In the present embodiment, the elongated region 102 and the protruding region 104 for example, constitute the display region of the display panel DP, and the display region has a watch shaped appearance. Furthermore, the drive connection region 106 is for example, located in a non-display region of the display panel DP. In the above embodiments, a watch having a circular watch surface is taken as an example, but the present invention is not particularly limited thereto. For instance, the protruding region 104 may have other shapes, so that the display region constructed by the elongated region 102 and the protruding region 104 may have a watch surface with other shapes (for instance, square, triangular, trapezoidal, dumbbell-shaped etc.). In the above embodiments, a length L2 of a connection side connecting the protruding region 104 to the elongated region 102 is smaller than a length L1 of the first sides 102A. Additionally, when measuring in a direction parallel with the first side 102A, the length of the protruding region 104 is smaller than the length of the elongated region 102. As such, the protruding region 104 that protrudes out from the first sides 102A of the elongated region 102 in fact do not exceed a length of the first sides 102A. Accordingly, a display panel having a watch shaped appearance can be constructed.

In the embodiment of FIG. 1A and FIG. 1B, the pixel array 10B is located on the substrate 10A, and includes a plurality of pixel structures 130, a plurality of signal lines 110, a plurality of signal lines 112, a plurality of first dummy wirings 120A and a plurality of second dummy wirings 120B. In the embodiment of FIGS. 1A and 1B, the amount of the signal lines 110, the signal lines 112, the first dummy wirings 120A and the second dummy wirings 120B are for illustration purposes only, in fact, the amount of signal lines and dummy wirings are not limited to those shown in FIGS. 1A and 1B. The pixel structure 130 includes pixel electrodes 131 and active devices 132. In order to make the present invention clear and comprehensive to those skilled in the art, only one of the pixel electrode 131 and active device 132 are illustrated for description. The signal lines 110 and signal lines 112 are electrically connected to the corresponding pixel structures 130 respectively, and the signal lines 110 and signal lines 112 are used for driving the pixel electrode 131. More specifically, the signal lines 110 can be data lines, and the signal lines 112 can be scan lines, however, the present invention is not limited thereto. In another embodiment, the signal lines 110 can be scan lines, and the signal lines 112 can be data lines. In the above embodiment, the scan line (110 or 112) and data line (110 or 112) are intersecting each other, and an insulating layer is interposed between the scan line and the data line. That is, the extension direction of the scan line is not parallel to the extension direction of the data line, and preferably, the extension direction of the scan line is intersecting or perpendicular to the extension direction of the data line. In consideration of conductivity, the scan line and the data line are generally made out of metal materials. However, the present invention is not limited thereto, according to other embodiments, the scan line and the data line can also use other conductive materials. For example: alloys, metallic materials of nitrides, metallic materials of oxides, metallic materials of nitrogen oxides, or other suitable materials, or stacked layers of metallic materials and other conductive materials.

With continued reference to FIG. 1B, the signal line 110 includes a plurality of long wirings 110A and a plurality of short wirings 110B. The long wirings 110A are disposed in the elongated region 102, and are parallel with the long-side direction D1 and extend to the drive connection region 106. The short wirings 110B are disposed in the protruding region 104, and are parallel with the long wirings 110A. Furthermore, the first dummy wirings 120A are disposed in the elongated region 102, and are parallel with the long-side direction D1 and extend to the drive connection region 106. The second dummy wirings 120B are disposed in the protruding region 104, and are parallel with the first dummy wirings 120A. In an embodiment of the present invention, each of the long wirings 110A is disposed adjacent to at least one of the first dummy wirings 120A, and the long wirings 110A and the dummy wirings 120A have the same length. Furthermore, each of the short wirings 110E is disposed adjacent to at least one of the second dummy wirings 120B.

In the above embodiments, the long wirings 110A and the short wirings 110B are one of the data lines or scan lines. That is to say, the long wirings 110A and the short wirings 110B are either both data lines or both scan lines, and they may have different lengths. As in the case of a non-rectangular display panel, the data lines/scan lines of different lengths are liable to have different impedance values when they are driven, wherein the difference in the impedance values directly affects the display quality of the display panel. In order to reduce the impedance value difference between the long wirings 110A and the short wirings 110B, the display panel in the embodiments of the present invention are provided with the first dummy wirings 120A and the second dummy wirings 120B. More specifically, the pixel array substrate 10 further includes a driving circuit 140 that is disposed in the drive connection region 106, wherein the long wirings 110A and the first dummy wirings 120A extend to the drive connection region 106 and are electrically connected to the driving circuit 140. Furthermore, the short wirings 110B are electrically connected to the corresponding first dummy wirings 120A through a connection line (not shown). That is to say, the short wiring 110B may be electrically connected to the driving circuit 140 through the first dummy wiring 120A. Additionally, the long wirings 110A are electrically connected to the corresponding second dummy wirings 120B through a connection line (not shown). Accordingly, by connecting the short wirings 110B to the longer first dummy wirings 120A, and connecting the long wirings 110A to the shorter second dummy wirings 120B, the impedance value difference formed when driving the long wirings 110A and the short wirings 110B may be alleviated.

In the above embodiments, the long wirings 110A and the short wirings 110B are electrically connected to the first dummy wirings 120A or the second dummy wirings 120B respectively through connections lines. Next, the arrangement manner of these connection lines will be described below.

Figure 2A:
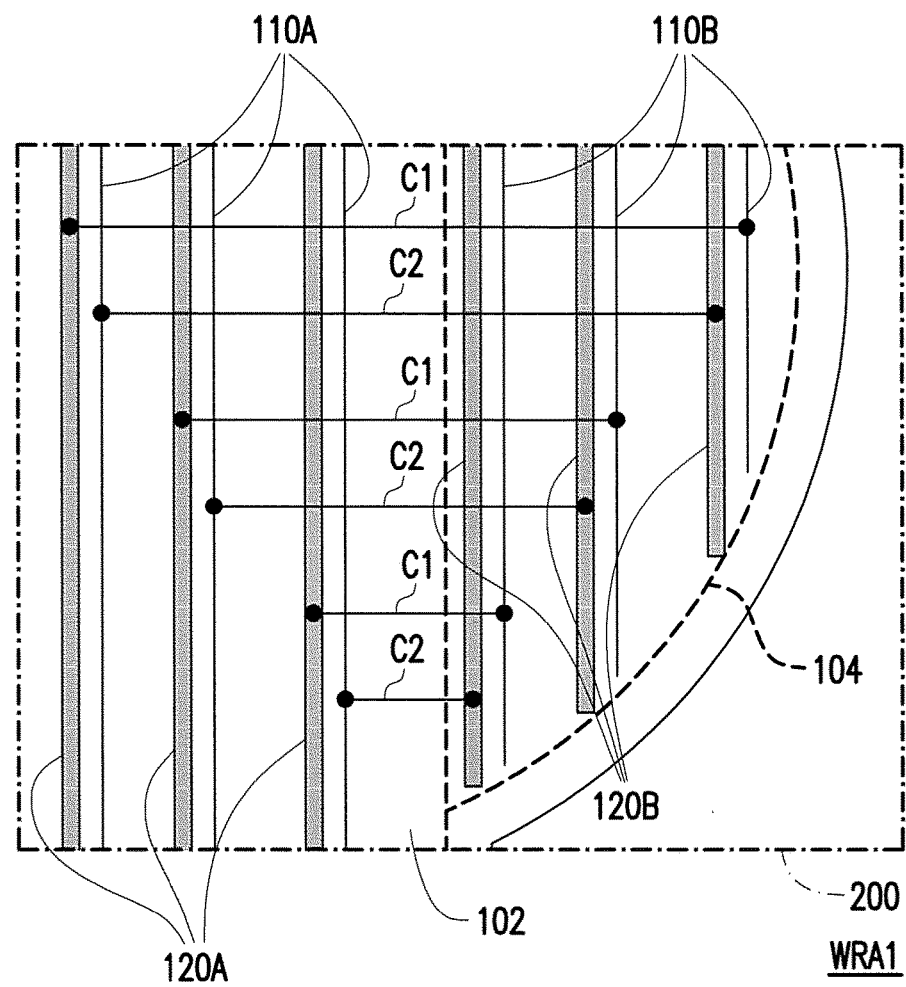
FIG. 2A is an enlarged view of the line array within region 200 of FIG. 1B according to an embodiment of the invention.

FIG. 2A is an enlarged view of the line array within region 200 of FIG. 1B according to an embodiment of the invention. Referring to FIG. 2A, the line array WRA1 includes a substrate, a plurality of long wirings 110A, a plurality of short wirings 110B, a plurality of first dummy wirings 120A, a plurality of second dummy wirings 120B, a plurality of first connection lines C1 and a plurality of second connection lines C2. The substrate may be referred to the substrate 10A as shown in FIG. 1A and FIG. 1B, wherein the substrate may include a first region such as an elongated region 102, a second region such as a protruding region 104 and a drive connection region 106. The elongated region 102 has first sides 102A that extend along a long-side direction D1, and second sides 102B that extend along a short-side direction D2. The protruding region 104 protrudes out from the first sides 102A, and is connected to the elongated region 102. The drive connection region 102 is connected to the second side 102B of the elongated region 102.

In the embodiment shown in FIG. 2A, the long wirings 110A and the first dummy wirings 120A are disposed in the elongated region 102, and as shown in FIG. 1B, the long wirings 110A and the first dummy wirings 120A are parallel with the long-side direction D1, and extend to the drive connection region 106 to be electrically connected to the driving circuit 140. Furthermore, the short wirings 110B and the second dummy wirings 120B are disposed in the protruding region 104, and are parallel with the long wirings 110A and the first dummy wirings 120A. In the present embodiment, the short wiring 110B is electrically connected to a corresponding first dummy wiring 120A through one of the first connection lines C1, and the long wiring 110A is electrically connected to a corresponding second dummy wiring 120B through one of the second connection lines C2. More specifically, the short wiring 110B located at the very edge of the protruding region 104 is electrically connected to the first dummy wiring 120 that is farther away (or located near the center of the elongated region 102). Furthermore, the short wiring 110B that is located on an inner side of the protruding region 104 closer to the elongated region 102 is electrically connected to the closest first dummy wiring 120A nearby (or located near the edge of the elongated region 102). Similarly, the long wiring 110A located near the center of the elongated region 102 is electrically connected to the second dummy wiring 120B that is farther away (near an edge of the protruding region 104). Furthermore, the long wiring 110A located near an edge of the elongated region 102 is electrically connected to the closest second dummy wiring 120B nearby (near the inner side of the protruding region 104). In the present embodiment, since the short wiring 110B is connected to the longer first dummy wiring 120A through the first connection line C1, and the long wiring 110A is electrically connected to the shorter second dummy wiring 120B through the second connection line C2, therefore, an impedance value difference formed when driving the long wirings 110A and the short wirings 110B can be alleviated.

Figure 2B:
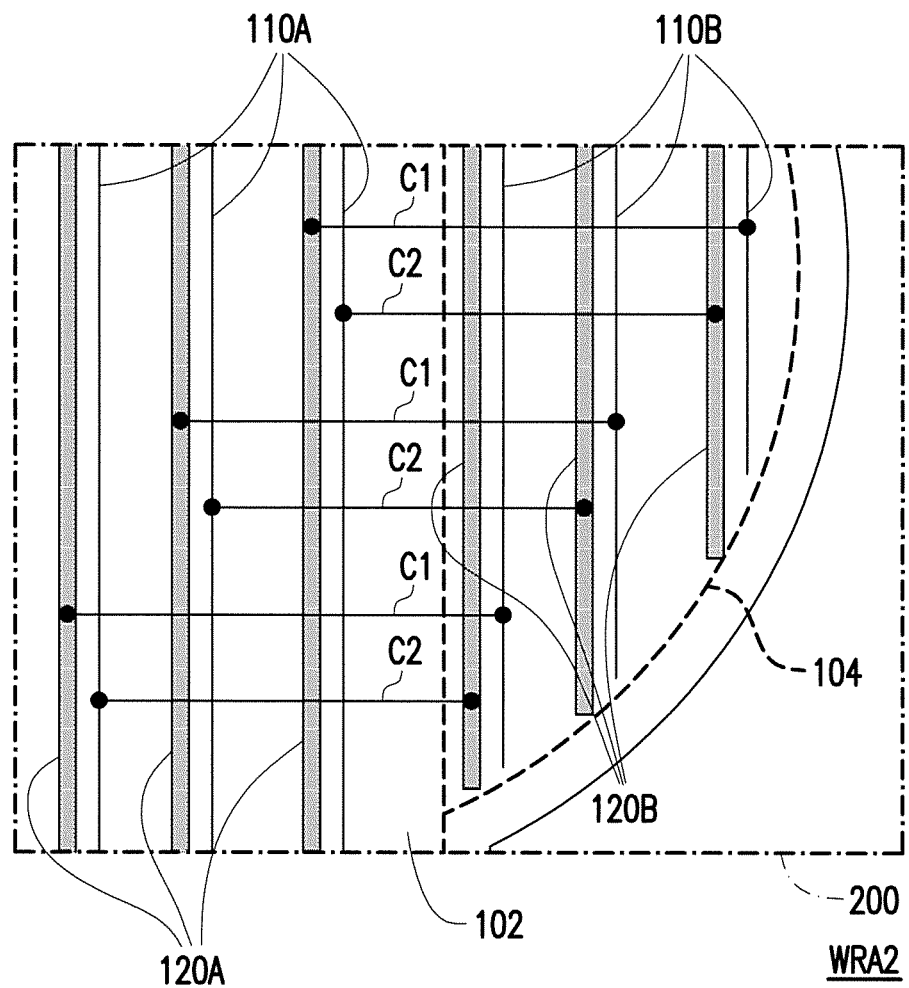
FIG. 2B is an enlarged view of the line array within region 200 of FIG. 1B according to another embodiment of the invention.

FIG. 2B is an enlarged view of the line array within region 200 of FIG. 1B according to another embodiment of the invention. The embodiment of FIG. 2B is similar to the embodiment of FIG. 2A, the only difference is that the arrangement of the first connection lines C1 and the second connection lines are different. Referring to FIG. 2B, in line array WRA2, the long wirings 110A and the first dummy wirings 120A are disposed in the elongated region 102, and as shown in FIG. 1B, the long wirings 110A and the first dummy wirings 120A are parallel with the long-side direction D1, and extend to the drive connection region 106 to be electrically connected to the driving circuit 140. Furthermore, the short wirings 110B and the second dummy wirings 120B are disposed in the protruding region 104, and are parallel with the long wirings 110A and the first dummy wirings 120A. In the present embodiment, the short wiring 110B is electrically connected to a corresponding first dummy wiring 120A through one of the first connection lines C1, and the long wiring 110A is electrically connected to a corresponding second dummy wiring 120B through one of the second connection lines C2. More specifically, the short wiring 110B located near the very edge of the protruding region 104 is electrically connected to the closest first dummy wiring 120A nearby (or near an edge of the elongated region 102). Furthermore, the short wiring 110B located near an inner edge of the protruding region 104 closer to the elongated region 102 is electrically connected to the first dummy wiring 120A that is farther away (or located near the center of the elongated region 102). Similarly, the long wiring 110A located near the center of the elongated region 102 is electrically connected to the closest second dummy wiring 120B nearby (near the inner side of the protruding region 104). Furthermore, the long wiring 110A located near the edge of the elongated region 102 is electrically connected to the second dummy wiring 120B farther away (near the edge of the protruding region 104). In the present embodiment, since the short wiring 110B is connected to the longer first dummy wiring 120A through the first connection line C1, and the long wiring 110A is electrically connected to the shorter second dummy wiring 120B through the second connection line C2, therefore, an impedance value difference formed when driving the long wirings 110A and the short wirings 110B can be alleviated.

In the embodiments shown in FIG. 1B, FIG. 2A and FIG. 2B above, all of the short wirings 110B are electrically connected to the first dummy wirings 120A, and all of the long wirings 110A are electrically connected to the second dummy wirings 120B, however, the present invention is not limited thereto. For example, in another embodiment, the short wirings 110B are electrically connected to the first dummy wirings 120A, but a second dummy wiring 120B was not arranged. In such embodiments, since the short wirings 110B are already connected to the first dummy wirings 120A through the first connection line C1, therefore, the technical effect of reducing the impedance value difference can also be achieved. Furthermore, although the embodiments shown in FIG. 1B, FIG. 2A and FIG. 2B are exemplified by a watch shaped display panel for explanation, however, it should be noted that the concept of the present invention can be applied to any irregular/non-rectangular display panels.

Furthermore, in an embodiment of the invention, a line array structure can be constructed by the above substrate, the plurality of long wirings 110A, the plurality of short wirings 110B, the plurality of first dummy wirings 120A, the plurality of first connection lines C1, the plurality of second dummy wirings 120B and the plurality of second connection lines C2. As such, the line array structure of the present invention can also be used to resolve the unbalanced impedance value problem.

According to the above, the line array structure, pixel array substrate and display panel of the present invention, since the short wiring is connected to the longer first dummy wiring through the first connection line, and the long wiring is electrically connected to the shorter second dummy wiring through the second connection line, and both of the first dummy wirings and the long wirings extend to the drive connection region, therefore, an impedance value difference formed between the long wirings and the short wirings can be alleviated, and the unbalanced impedance value problem can be resolved. As such, by setting out the dummy wirings, a better display quality can be provided to the non-rectangular display products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A line array structure, comprising:
   a substrate, having an elongated region, a protruding region and a drive connection region, wherein the elongated region has first sides that extend along a long-side direction and second sides that extend along a short-side direction, the protruding region protrudes out from the first sides and is connected to the elongated region, the drive connection region is connected to one of the second sides of the elongated region;
   a plurality of long wirings, disposed in the elongated region, and are parallel with the long-side direction and extend to the drive connection region;
   a plurality of short wirings, disposed in the protruding region and are parallel with the long wirings;
   a plurality of first dummy wirings, disposed in the elongated region, and are parallel with the long-side direction and extend to the drive connection region; and
   a plurality of first connection lines, wherein each of the short wirings is electrically connected to a corresponding first dummy wiring through one of the first connection lines.

2. The line array structure according to claim 1, further comprising:
   a driving circuit, disposed in the drive connection region, wherein, the long wirings and the first dummy wirings extend to the drive connection region and are electrically connected to the driving circuit.

3. The line array structure according to claim 1, wherein each of the long wirings is disposed adjacent to at least one of the first dummy wirings.

4. The line array structure according to claim 1, wherein the long wirings and the first dummy wirings have the same length.

5. The line array structure according to claim 1, wherein a length L2 of a connection side connecting the protruding region to the elongated region is smaller than a length L1 of the first sides.

6. The line array structure according to claim 1, further comprising:
a plurality of second dummy wirings disposed in the protruding region, and are parallel with the first dummy wirings; and
a plurality of second connection lines, wherein each of the long wirings is electrically connected to a corresponding second dummy wiring through one of the second connection lines.

7. The line array structure according to claim 6, wherein each of the short wirings is disposed adjacent to at least one of the second dummy wirings.

8. The line array structure according to claim 1, wherein the long wirings and the short wirings are data lines or scan lines.

9. A pixel array substrate, comprising:
a substrate, having a first region, a second region and a drive connection region, wherein the first region has first sides that extend along a long-side direction and second sides that extend along a short-side direction, the second region protrudes out from the first sides and is connected to the first region, the drive connection region is connected to the second side of the first region;
a pixel array, disposed on the substrate, wherein the pixel array comprises:
a plurality of pixel structures, disposed in the first region and the second region, wherein each of the pixel structure comprises a pixel electrode and an active device;
a plurality of first signal lines and a plurality of second signal lines, wherein each of the pixel structures is electrically connected to one of the first signal lines and one of the second signal lines, and the first signal lines and the second signal lines are used to drive the pixel structures, wherein the first signal lines or the second signal lines comprise a plurality of long wirings and a plurality of short wirings, the long wirings are disposed in the first region and are parallel with the long-side direction and extend to the drive connection region, and the short wirings are disposed in the second region, and are parallel with the long wirings;
a plurality of first dummy wirings, disposed in the first region, and are parallel with the long-side direction and extend to the drive connection region; and
a plurality of first connection lines, wherein each of the short wirings is electrically connected to a corresponding first dummy wiring through one of the first connection lines.

10. The pixel array substrate according to claim 9, further comprising:
a driving circuit, disposed in the drive connection region, wherein, the long wirings and the first dummy wirings extend to the drive connection region and are electrically connected to the driving circuit.

11. The pixel array substrate according to claim 9, wherein each of the long wirings is disposed adjacent to at least one of the first dummy wirings.

12. The pixel array substrate according to claim 9, wherein the long wirings and the first dummy wirings have the same length.

13. The pixel array substrate according to claim 9, wherein a length L2 of a connection side connecting the second region to the first region is smaller than a length L1 of the first sides.

14. The pixel array substrate according to claim 9, wherein the pixel array substrate further comprises:
a plurality of second dummy wirings disposed in the second region, and are parallel with the first dummy wirings; and
a plurality of second connection lines, wherein each of the long wirings is electrically connected to a corresponding second dummy wiring through one of the second connection lines.

15. The pixel array substrate according to claim 14, wherein each of the short wirings is disposed adjacent to at least one of the second dummy wirings.

16. The pixel array substrate according to claim 9, wherein the first signal lines are data lines, and the second signal lines are scan lines.

17. The pixel array substrate according to claim 9, wherein the first signal lines are scan lines, and the second signal lines are data lines.

18. A display panel, comprising the pixel array substrate according to claim 9 and a display medium, wherein the display medium is driven by the pixel array substrate for display.

* * * * *